US009359665B2

(12) United States Patent
Dexter et al.

(10) Patent No.: US 9,359,665 B2
(45) Date of Patent: Jun. 7, 2016

(54) METHOD OF MANUFACTURING SWAGE MOUNT HAVING A MIXTURE OF CONDUCTIVE MATERIAL AND A COATING MATERIAL

(71) Applicant: Intri-Plex Technologies, Inc., Santa Barbara, CA (US)

(72) Inventors: David Django Dexter, Goleta, CA (US); Ryan John Schmidt, Santa Barbara, CA (US); Paul Wesley Smith, Santa Barbara, CA (US)

(73) Assignee: INTRI-PLEX TECHNOLOGIES, INC., Santa Barbara, CA (US)

( * ) Notice: Subject to any disclaimer, the term of this patent is extended or adjusted under 35 U.S.C. 154(b) by 0 days.

(21) Appl. No.: 14/806,434

(22) Filed: Jul. 22, 2015

(65) Prior Publication Data
US 2015/0361537 A1 Dec. 17, 2015

Related U.S. Application Data

(62) Division of application No. 14/306,074, filed on Jun. 16, 2014, now Pat. No. 9,123,367.

(51) Int. Cl.
*G11B 21/16* (2006.01)
*C22F 1/16* (2006.01)
*G11B 5/48* (2006.01)
*C22F 1/10* (2006.01)
*C22F 1/14* (2006.01)
(Continued)

(52) U.S. Cl.
CPC ... *C22F 1/16* (2013.01); *C22F 1/10* (2013.01); *C22F 1/14* (2013.01); *C23C 14/165* (2013.01); *C25D 3/12* (2013.01); *C25D 3/50* (2013.01); *C25D 3/56* (2013.01); *G11B 5/4813* (2013.01); *G11B 5/4833* (2013.01); *G11B 5/4873* (2013.01); *G11B 21/16* (2013.01)

(58) Field of Classification Search
CPC .. G11B 5/4813; G11B 5/4833; G11B 5/4826; G11B 21/16; G11B 5/4873; Y10T 428/12493; Y10T 428/12944; C22F 1/16; C22F 1/10; C22F 1/14; C23C 14/165; C25D 3/12; C25D 3/50; C25D 3/56
USPC ......... 360/244.5, 244.6, 294.4; 427/123, 124, 427/125, 299, 383.1, 383.7; 29/592.2, 29/603.07; 148/513, 559, 606, 653
See application file for complete search history.

(56) References Cited

U.S. PATENT DOCUMENTS 3,583,930 A   6/1971 Ehrreich et al.
5,672,435 A   9/1997 Born et al.
(Continued)

OTHER PUBLICATIONS

International Application No. PCT/US 15/34795; International Search Report dated Sep. 4, 2015; 1 page.

*Primary Examiner* — Will J Klimowicz

(57) ABSTRACT

A swage mount is manufactured for attaching a head suspension assembly to a head actuator arm for a hard disk drive. A conductive material is deposited on a predetermined part of the swage mount. A coating material is deposited on the swage mount including the predetermined part. Heat is applied to the swage mount, forming a mixture of the conductive material and the coating material. The mixture is conductive and supports a reliable connection between the swage mount and other disk drive components. Furthermore, the mixture enhances cleanliness by reducing particles shed from the swage mount. The conductive material is preferably gold, and the coating material is preferably nickel-based.

22 Claims, 14 Drawing Sheets

(51) Int. Cl.
*C23C 14/16* (2006.01)
*C25D 3/12* (2006.01)
*C25D 3/50* (2006.01)
*C25D 3/56* (2006.01)

(56) References Cited

U.S. PATENT DOCUMENTS

| | | |
|---|---|---|
| 5,833,777 A | 11/1998 | Hanrahan et al. |
| 6,231,698 B1 * | 5/2001 | Braunheim .......... G11B 5/4826 148/606 |
| 6,754,044 B1 | 6/2004 | Braunheim et al. |
| 7,304,824 B2 | 12/2007 | Brink et al. |
| 7,324,307 B2 | 1/2008 | Brink et al. |
| 8,142,638 B2 | 3/2012 | Brink et al. |
| 8,446,694 B1 | 5/2013 | Tian et al. |
| 8,542,465 B2 | 9/2013 | Liu et al. |
| 8,570,688 B1 | 10/2013 | Hahn et al. |
| 9,123,367 B1 * | 9/2015 | Dexter ................. G11B 5/4813 |
| 2003/0156357 A1 | 8/2003 | Brink et al. |
| 2004/0145830 A1 | 7/2004 | Brink et al. |
| 2005/0099731 A1 * | 5/2005 | Brink .................... G11B 5/4833 360/244.6 |
| 2006/0023363 A1 | 2/2006 | Hanrahan et al. |
| 2006/0289311 A1 * | 12/2006 | Brink .................... G11B 5/4813 205/134 |
| 2011/0011747 A1 | 1/2011 | Brink et al. |
| 2011/0085269 A1 | 4/2011 | Hanya et al. |

* cited by examiner

METHOD OF MANUFACTURING SWAGE MOUNT HAVING A MIXTURE OF CONDUCTIVE MATERIAL AND A COATING MATERIAL

CROSS REFERENCE TO RELATED APPLICATIONS

This application is a division of application Ser. No. 14/306,074 filed Jun. 16, 2014 for SWAGE MOUNT HAVING A MIXTURE OF A CONDUCTIVE MATERIAL AND A COATING MATERIAL AND METHOD OF MANUFACTURING THE SWAGE MOUNT.

FIELD OF THE INVENTION

The present invention relates to swage mounts for hard disk drives and methods of manufacturing swage mounts.

DESCRIPTION OF RELATED ART

In hard disk drives, data are stored on surfaces of a plurality of rotatable disks mounted on a housing of the drive. An actuator positions transducer heads in alignment with concentric data tracks defined on the disks. The transducer heads write data to and read data from the disk surfaces. Each transducer head is attached to one end of a head suspension that is connected to an actuator arm that extends from the actuator body.

FIG. 1 is a top view illustration of a head suspension assembly 30 that can be connected to an actuator arm (not shown). The head suspension assembly 30 includes a swage mount 31. The swage mount 31 is made of a base material such as stainless steel. The swage mount 31 has a flange portion 37 that includes a flange body portion 32 connected to a tip portion 33. The tip portion 33 vibrates in-plane and is shaped in the form of the letter 'T.' The swage mount 31 optionally includes a through-hole 36. A hub 35 surrounds an aperture of the flange body portion 32 and extrudes out of plane. The head suspension assembly 30 is swaged onto the actuator arm by inserting and swaging the hub 35 into a hole in the actuator arm.

Primary actuation is performed, for example, using a voice coil motor integrated into the actuator arm. In addition, at least one of a secondary actuation near the swage mount 31 or a direct movement of the head near the flexure 25 can be performed. The flexure 25 locates the head, which is bonded underneath the flexure 25. The flexure 25 locates the head rigidly in the x-z plane while allowing the head to rotate. The head can fly very closely to the disk surface without contacting it in order to read and/or write small magnetic bits. Rotation of the head maintains proper fly height and attitude with respect to the disk.

Piezoelectric transducers (PZTs) 17 are provided as secondary actuators that mechanically position the head in a planar direction in response to applied electrical charge. The PZTs 17 include surfaces covered with conductive material such as gold. The gold-covered top surface can be the ground side of the PZT 17. The ground path passes through the swage mount 31, the swaged hub, the actuator arm and the actuator arm connection. Conductive contacts 19 connect the PZT 17 to a ground path. The gold-covered bottom surface can be connected to an electronic circuit (e.g., an electronic circuit for the flexure 25). Alternatively, the bottom surface can be the ground side, and the top surface can be the circuit connection. The bottom and/or top surfaces of the PZTs 17 can be connected to other electrical components in the drive. The conductive contacts 19 can be silver filled epoxies for providing a conductive link between the swage mount 31 and the PZTs 17. Alternatively, the contacts 19 are soldered conductive contacts.

The conductive contacts 19 can be positioned on different locations based on design concerns. FIG. 1 shows the conductive contacts 19 positioned between the PZTs 17 and the cross-bar part of the 'T'-shaped tip portion 33. FIG. 2 shows that the conductive contacts 19 are positioned on an opposite side of the PZTs 17, thereby connecting the PZTs 17 to the flange body portion 32.

FIG. 3 shows the swage mount 31 in isolation. The PZTs 17 actuate the head to move or vibrate in the x-z plane. The PZTs 17 bias the 'T' shaped tip portion 33 to vibrate substantially in-plane (in the x-z plane). Positive or negative charges are applied to the PZTs 17 resulting in their expansion and/or contraction. As a result, the head is moved for a read/write process on the underlying disk.

The foregoing structure does not provide reliable conductivity for electrically connecting the swage mount 31 to the PZTs 17, or for electrically connecting the swage mount 31 to other components of the drive. Furthermore, the electrical connections and the bond of the electrical contacts significantly degrade after exposure to temperature and humidity changes present in the hard disk drive environment. For example, the electrical connection and the bond between conductive contacts 19 and the stainless steel tip portion 33 is unreliable in part because chromium oxide is formed on the stainless steel surface. Unreliable conductivity results in drive performance failures.

To improve conductivity, prior art swage mounts have been plated with gold in parts on which the conductive contacts 19 are placed. However, this process is unduly expensive. In addition, stainless steel or other base materials with similar characteristics around the gold-plated regions lack sufficient cleanliness. Exposed hard particles or metal oxides of the base materials shed and cause drive failures. Gold particles and base metal particles, such as stainless steel, are shed as well in areas of the drive that require to be kept clean for optimal performance. For example, gold particles and stainless steel particles are shed in the head-to-disk interface and the disk surface. The generated base material and gold particles significantly deteriorate hard disk drive performance.

To achieve cleanliness, hard disk drive components other than swage mounts are plated with nickel. Nickel-plated surfaces shed fewer particles than un-plated stainless steel or aluminum surfaces. Nickel surfaces are also more easily cleaned of foreign contaminants before drive assembly. The few shed nickel particles are less harmful to drive performance than metal oxide particles or other metal particles such as stainless steel, gold or aluminum particles. High phosphorous content electroless nickel plating is most commonly used. However, nickel-plated surfaces are not sufficiently conductive and cannot support a reliable electrical connection. Nickel oxides and other nickel surface properties of a nickel-plated surface negatively impact electrical reliability of conductive contacts 19 positioned thereon after environmental exposure.

Furthermore, commonly used nickel plating such as electroless nickel is not sufficiently ductile and therefore fractures during the swaging process. One or more swage balls are passed through the inside diameter of the hub 35 in the swaging process. The balls are larger than hub 35 such that the hub 35 is permanently deformed. The hub 35 is press-fit or swaged into the swage hole of the actuator arm. Plated material that is not ductile enough or not adhered well to the swage mount fractures when swaging force and torque are applied. The fractured material sheds a significant amount of particles, thereby causing drive failure.

There is a need in the art for a swage mount and method of manufacturing the swage mount that significantly reduces generation of particles that impact hard disk drive performance. There is also a need in the art for a swage mount and method of manufacturing the swage mount that can support a reliable electrical connection even after environmental exposure.

SUMMARY OF THE INVENTION

A swage mount is provided for attaching a head suspension assembly to a head actuator arm for a hard disk drive. A conductive material is deposited on a predetermined part of the swage mount. A coating material is deposited on the swage mount including the predetermined part. Heat is applied to the swage mount, forming a mixture of the conductive material and the coating material. The mixture is conductive and provides a reliable connection between the swage mount and other disk drive components. Furthermore, the mixture enhances cleanliness by reducing particles shed from the swage mount.

In certain embodiments, the conductive material is deposited on a predetermined part of a base material. The swage mount is then stamped from the base material. The swage mount is cleaned and deburred. A coating material is deposited on the swage mount including the predetermined part. Heat is applied to the swage mount to form a conductive mixture of the conductive material and the coating material on the swage mount.

Each of the foregoing steps can be performed before or after stamping a swage mount from the base material based on design concerns. In certain embodiments, the conductive material and the coating material are deposited on the swage mount, and the swage mount is heat treated after stamping, deburring, and cleaning. Alternatively, the conductive material and the coating material are deposited on the base material before stamping, and the base material is heat treated before stamping a swage mount from the base material.

The conductive material is preferably gold, and the coating material is preferably nickel-based. Gold is deposited on a predetermined part of the swage mount. The swage mount including the predetermined part is plated with nickel or sulfamate nickel. The swage mount is heat treated or annealed, for example, in a heat furnace. Gold regions diffuse through the plated nickel layer.

The heat-treated mixture provides a low-impedance and reliable electrical connection. The coating material in the mixture and in other parts of the swage mount advantageously enhances cleanliness by reducing particles shed from the swage mount into the disk drive areas. Accordingly, disk drive failure as a result of shed particles is prevented.

BRIEF DESCRIPTION OF THE DRAWINGS

The exact nature of this invention, as well as the objects and advantages thereof, will become readily apparent from consideration of the following specification in conjunction with the accompanying drawings in which like reference numerals designate like parts throughout the figures thereof and wherein.

DETAILED DESCRIPTION OF THE PREFERRED EMBODIMENTS

Figure 4:
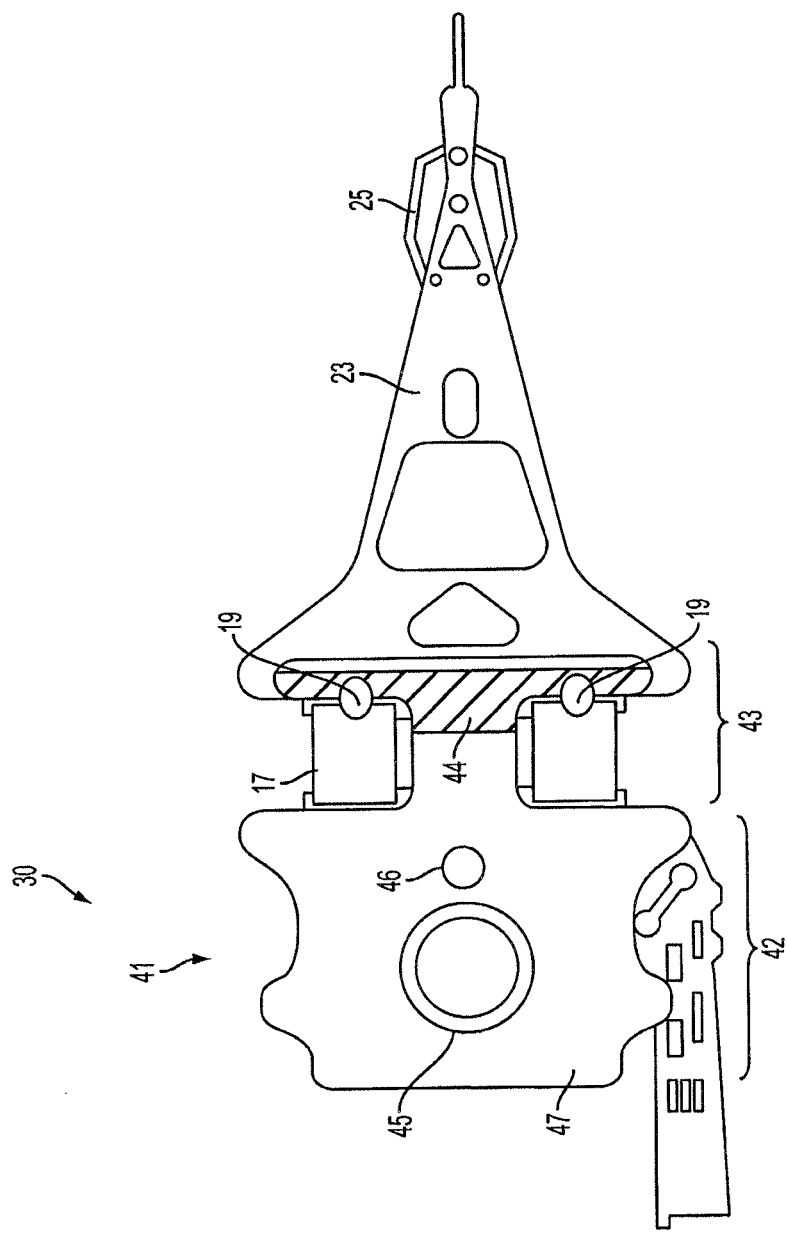
FIG. 4 is a top view illustration of a head suspension assembly.

FIG. 4 shows a swage mount 41 with a heat-treated conductive mixture deposited on a predetermined part 44. The predetermined part 44 is designed to include areas requiring an electrical connection. The mixture on the predetermined part 44 is conductive and provides a reliable electrical connection between the swage mount 41 and an electromechanical actuator (e.g., the PZT 17). The conductive contacts 19 are positioned on or adjacent to the predetermined part 44. The conductive contacts 19 electrically connect the mixture to another component of the drive. For example, the conductive contacts 19 connect the PZTs 17 to a ground path that passes through the conductive mixture on the predetermined part 44.

Figure 1:
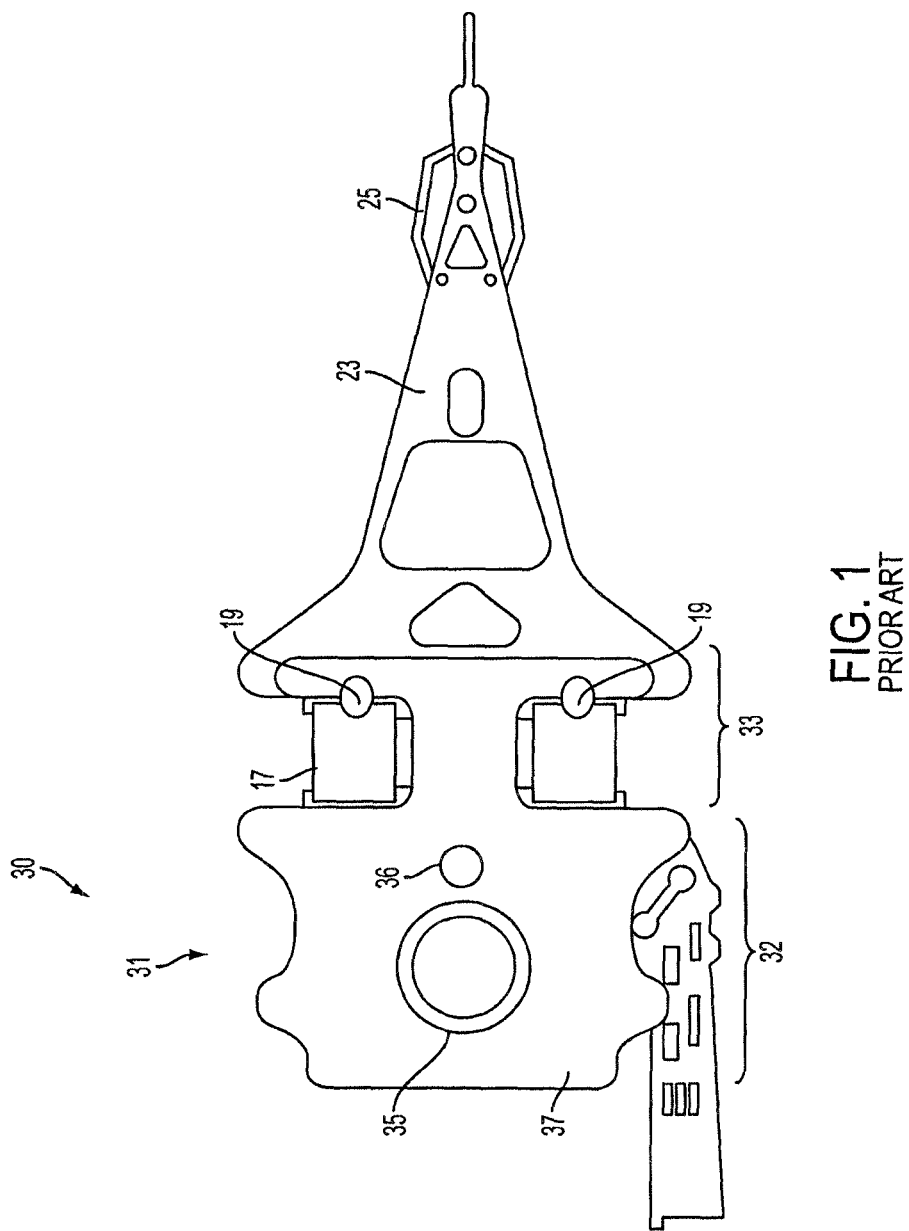
FIG. 1 is a top view illustration of a head suspension assembly of a hard disk drive.
Figure 2:
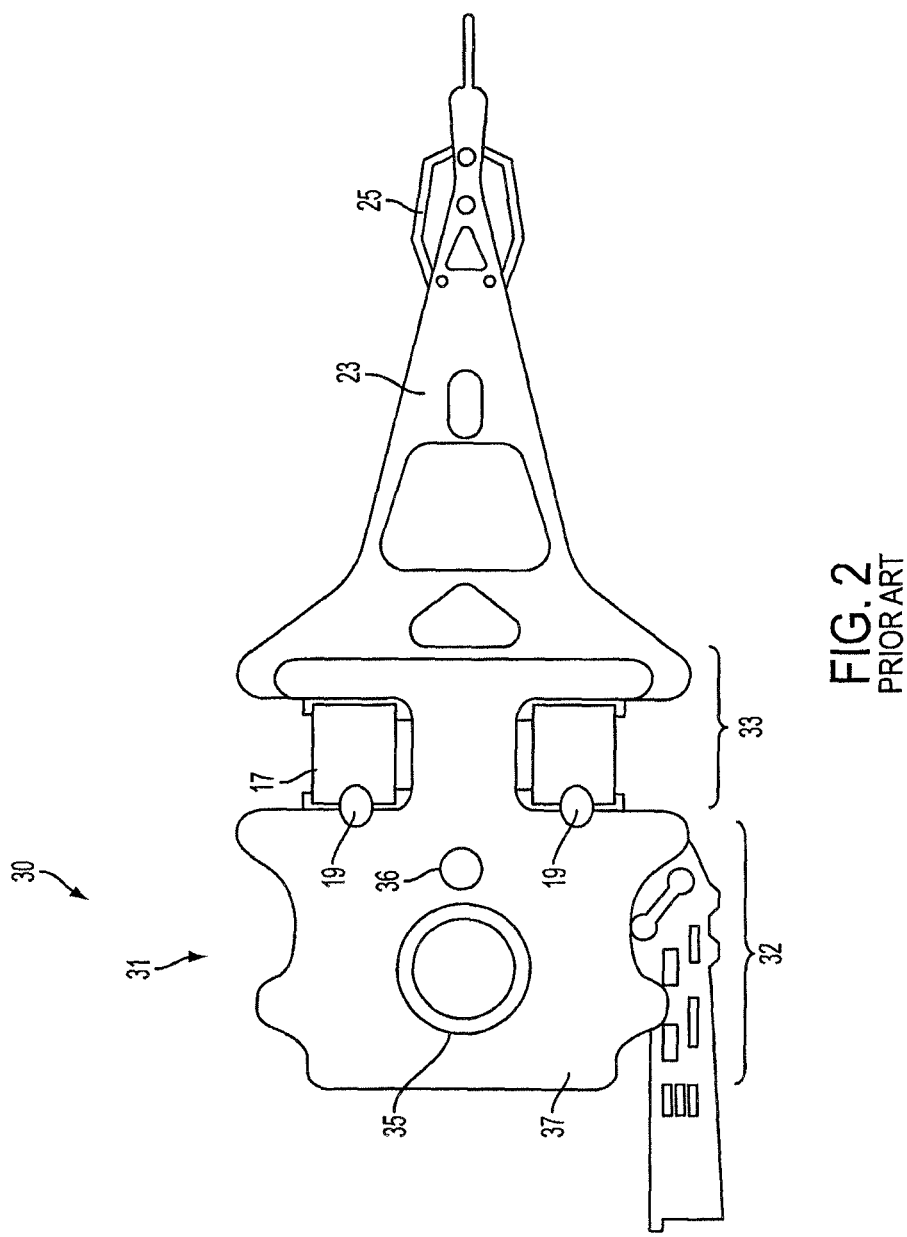
FIG. 2 is a top view illustration of a head suspension assembly.
Figure 3:
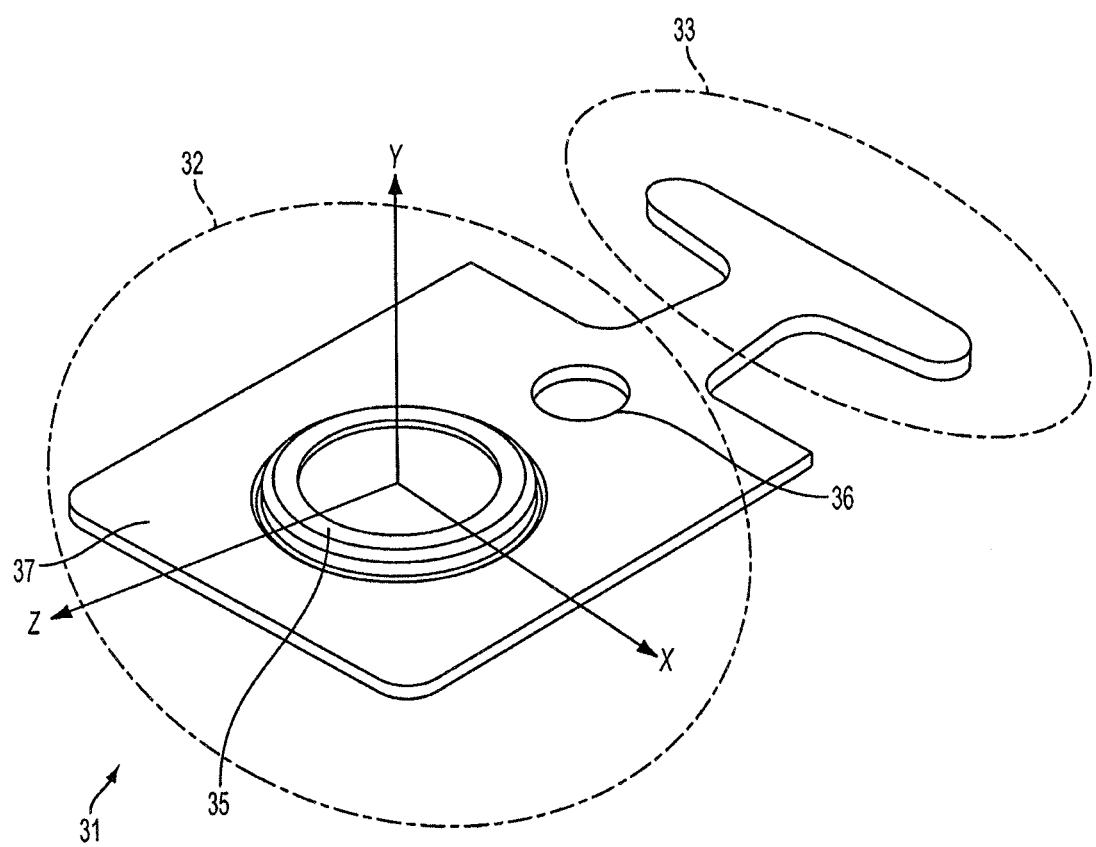
FIG. 3 is a perspective illustration of a swage mount for a hard disk drive.
Figure 5:
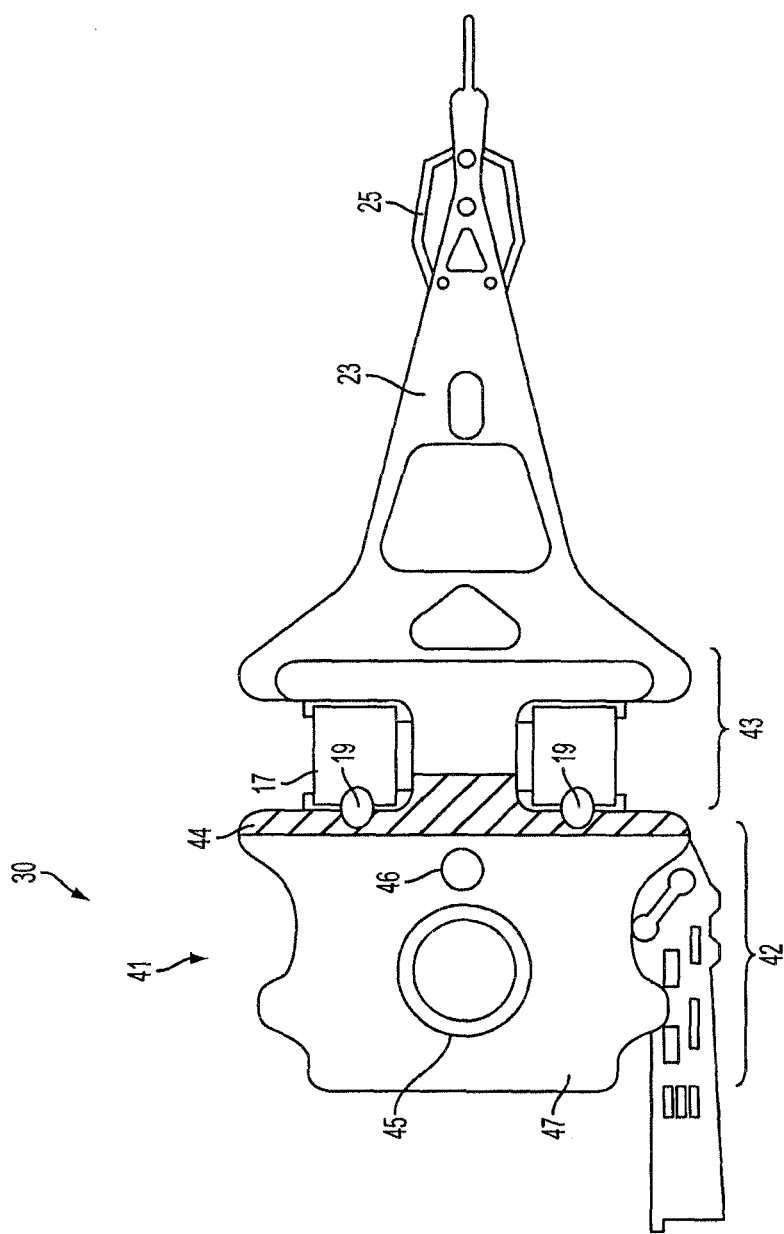
FIG. 5 is a top view illustration of a head suspension assembly.

FIG. 5 shows that the conductive contacts 19 are alternatively positioned on an opposite side of the PZTs similar to conductive contacts 19 in FIG. 2. Accordingly, the predetermined part 44 covers an area extending from the stem part of the 'T' shaped tip portion 43 to a portion of the flange body portion 42. The conductive contacts 19 are positioned on or adjacent to the predetermined part 44. The predetermined part 44 and the conductive contacts 19 can be positioned on other areas of the swage mount that need to be electrically connected to another component of the disk drive.

Figure 6:
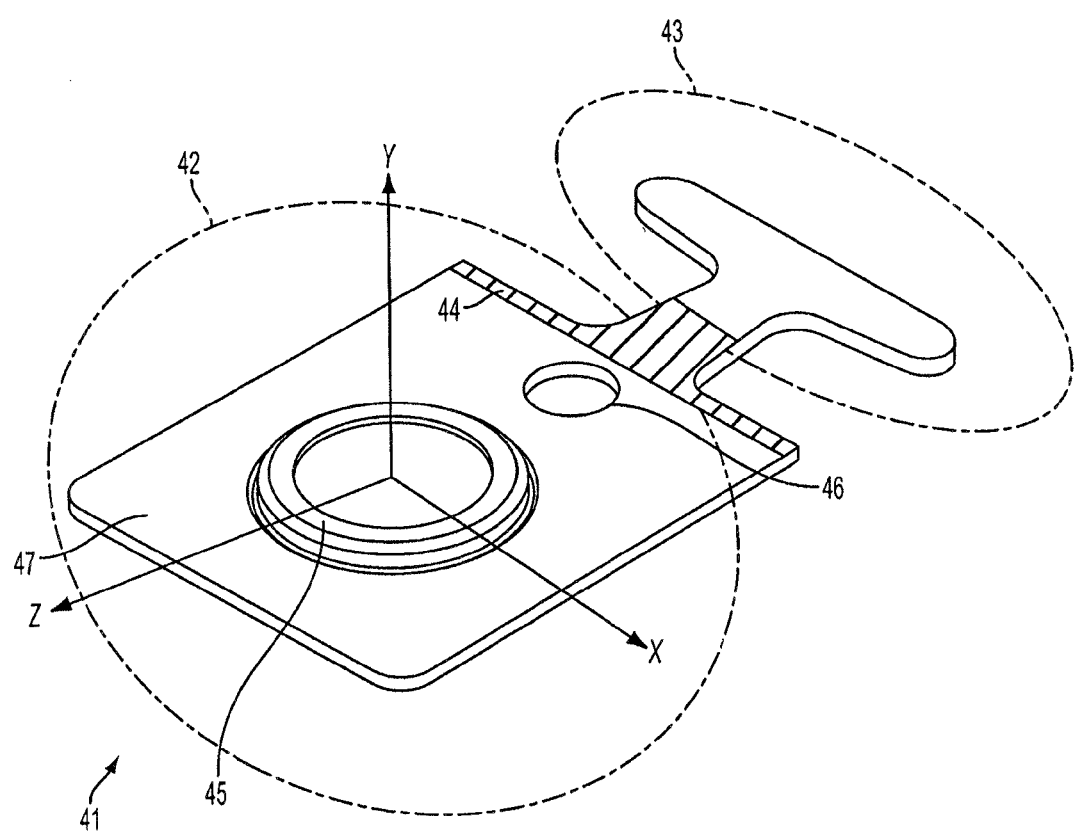
FIG. 6 is a perspective illustration of a swage mount for a hard disk drive.

FIG. 6 shows a swage mount 41 in isolation. The mixture covers the predetermined part 44. The predetermined part 44 extends from a stem part of the 'T'-shaped tip portion 43 to an area between the through-hole 46 and the stem part.

In a preferred embodiment, the conductive mixture is a mixture of gold and nickel or sulfamate nickel. In order for the mixture to be adequately conductive, the percentage of gold in the heat-treated nickel-gold mixture can be predetermined to be greater than or equal to 2 percent and less than or equal to 30 percent, or more particularly greater than or equal to 8 percent and less than or equal to 14 percent.

Alternatively, materials other than gold can be utilized for providing high conductivity. For example, the conductive material is platinum, rhodium, tin, and silver, or an alloy thereof. Alternatively, coating materials other than nickel can be utilized for enhancing cleanliness. For example, palladium or an alloy of palladium can be applied. The combination of the conductive material and the coating material is selected such that a heat-treated mixture of the materials has high conductivity and enhances cleanliness.

Figure 7:
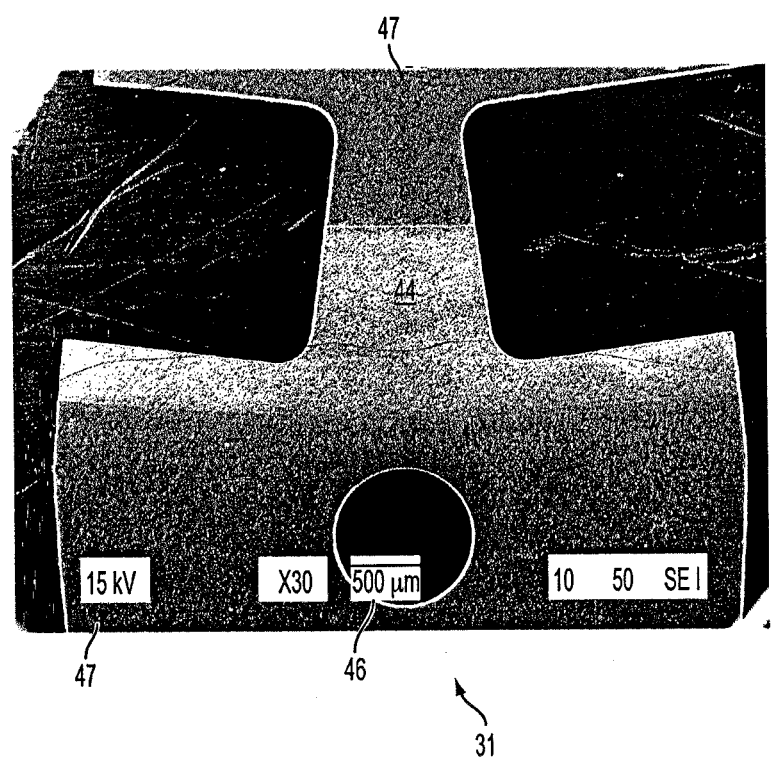
FIG. 7 is a top view scanning electron microscope (SEM) image of a swage mount.

FIG. 7 shows a top-view scanning electron microscope (SEM) image of a swage mount 41 after heat treatment. The mixture on the predetermined part 44 is formed of gold diffused through nickel. Nickel is formed in other parts 47 of the swage mount 41. Conductive contacts 19 can be positioned on or adjacent to the predetermined part 44, thereby connecting the swage mount 41 to the PZTs 17. The predetermined part 44 extends from the stem part of the 'T' shaped tip portion 43 to a portion of the flange body portion 42 proximal to the stem part. The arrangement allows the PZTs 17 as shown in FIG. 5 to be connected to the predetermined part 44 via conductive contacts 19.

Figure 8:
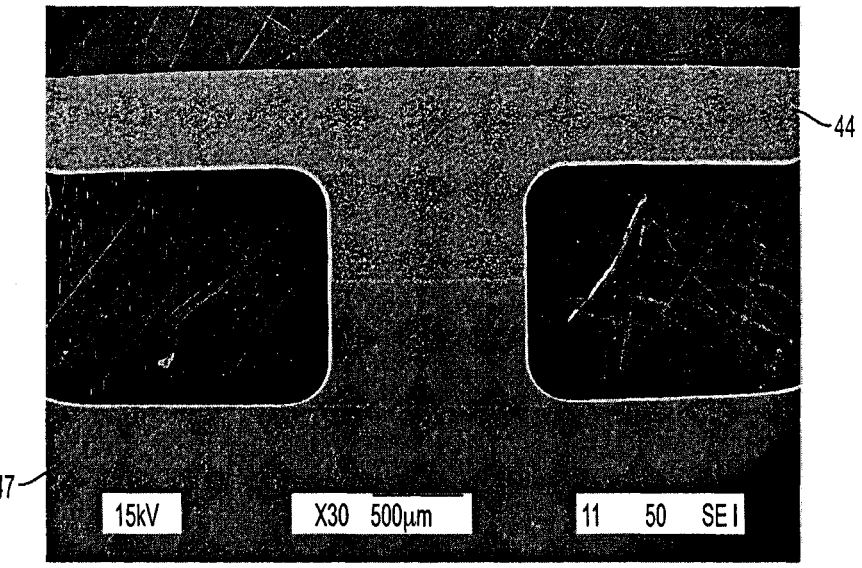
FIG. 8 is a top view SEM image of a swage mount.

FIG. 8 shows a top-view SEM image of a swage mount 41. The mixture covers the predetermined part 44 that extends from a cross-bar part of the 'T'-shaped tip portion 43 to a stem part of the 'T'-shaped tip portion 43. Conductive contacts 19 are positioned on or adjacent to the predetermined part 44 as shown in FIG. 4.

Figure 9:
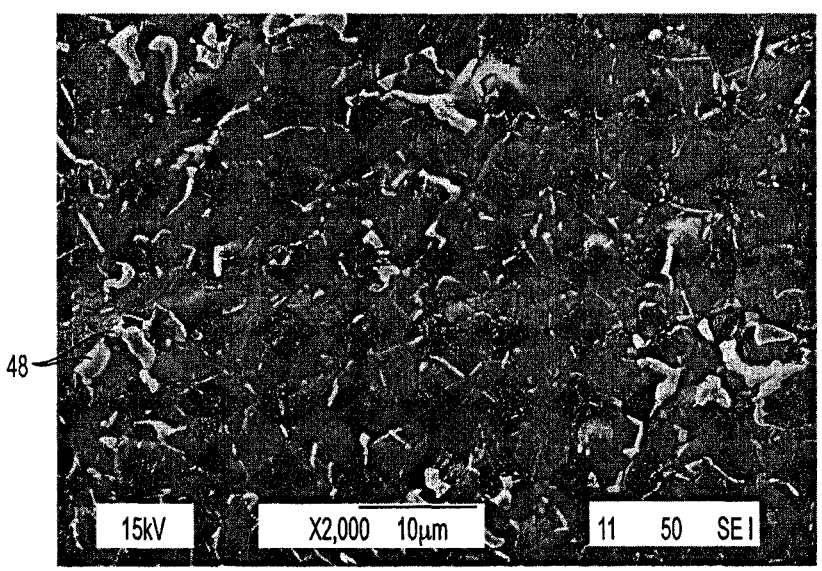
FIG. 9 is a magnified SEM image of the swage mount shown in FIG. 8.

FIG. 9 is a magnified SEM image of the predetermined part 44 shown in FIG. 8. Before heat treatment, nickel resided above the gold layer. After heat treatment, a percentage of gold diffuses through the nickel layer. As a result, gold regions exist in the surface of the predetermined part 44 after heat treatment. Gold islands 48 appear brighter in the magnified SEM image due to their high electrical conductivity. The percentage of gold in the heat-treated mixture can be chosen to provide sufficient conductivity. The percentage can be measured by energy-dispersive X-ray spectroscopy (EDS). The remaining percentage of nickel reduces particle shedding and enhances cleanliness.

The swage mount 41 having the conductive mixture provides a reliable electric connection, as shown by conductivity tests. The conductivity of the swage mount 41 was tested using an inductance, capacitance, and resistance/impedance meter (LCR meter). A swage mount is exposed to high humidity and high temperature after years of remaining in the hard disk drive. This environment was simulated by repeatedly exposing the swage mount 41 to a high temperature, 100 percent humidity environment. The test results showed that the swage mount 41 with the nickel-gold mixture remains highly conductive even after exposure to high humidity and temperature.

Furthermore, impedance of 30 pairs of swage mounts 41 was tested. Each swage mount 41 included a heat-treated nickel-gold mixture on a predetermined part 44 and plated nickel on other parts 47. The base material was stainless steel. The swage mounts of a pair were connected with one another by silver-filled epoxies placed on the gold-nickel mixtures. The impedance probes were placed on the stainless steel surface of each swage mount 41 in the pair. The tested 30 pairs had an average resistance of 0.12 ohms and a maximum resistance of 0.24 ohms after exposure to eight 15 minute cycles of high temperature, 100 percent humidity.

30 control group pairs of swage mounts were also tested using the same method. The control group swage mounts were made of stainless steel, but were not plated with nickel. The control group swage mounts did not include the nickel-gold mixture. After the same cycles of environmental exposure, the control group swage mounts had an average resistance of 18 ohms, which is too resistive for favorable hard disk drive performance. Furthermore, the connections were unreliable because a significant number of the control group connections failed as open connections after exposure to the high temperature, high humidity environment.

In addition to the remarkable conductive advantages, the nickel-gold mixture significantly enhances cleanliness, as shown by performed cleanliness tests. Cleanliness testing was performed on the swage mount 41 using a liquid particle count (LPC) tester to count particles shed by particle size. The particles shed during the LPC test were analyzed for composition using SEM/EDS (Scanning Electron Microscopy with X-ray microanalysis) in a liquid particle analysis (LPA) test.

Four samples of the swage mount 41 made of a stainless steel base material plated with nickel and having a heat-treat gold-nickel mixture were tested for cleanliness. The four samples had an average LPC count of 1,283 particles per square centimeter of part area. LPA results from these same groups showed an average of 79 stainless steel particles shed per square centimeter of surface area for the swage mount 41. Furthermore, the plated nickel and the heat-treated gold-nickel mixture nearly eliminated generation of gold particles down to a level of four particles per square centimeter.

The control group included four samples of stainless steel swage mounts known in the art. The swage mounts were not nickel plated and did not include a nickel-gold mixture. The control group swage mounts shed an average of 2,611 overall particles, an average of 908 stainless steel particles and an average of 278 gold particles per square centimeter. The test results confirmed that utilizing the heat-treated mixture significantly enhances cleanliness of the swage mount.

As shown by conductivity and cleanliness test results, heat-treating a coating material deposited on a conductive material according to the present invention significantly enhances conductivity and cleanliness of swage mounts.

Figure 10:
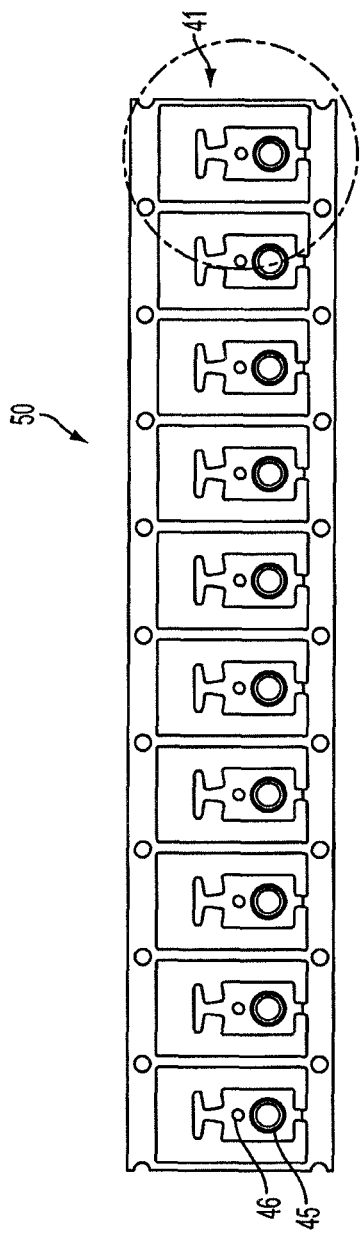
FIG. 10 is a top view illustration of swage mounts manufactured on a fret.
Figure 12:
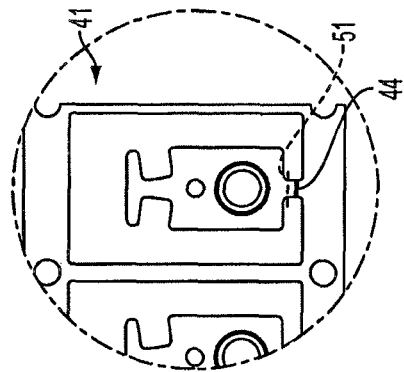
FIG. 12 is a magnified view of the swage mount shown in FIG. 10.
Figure 11:
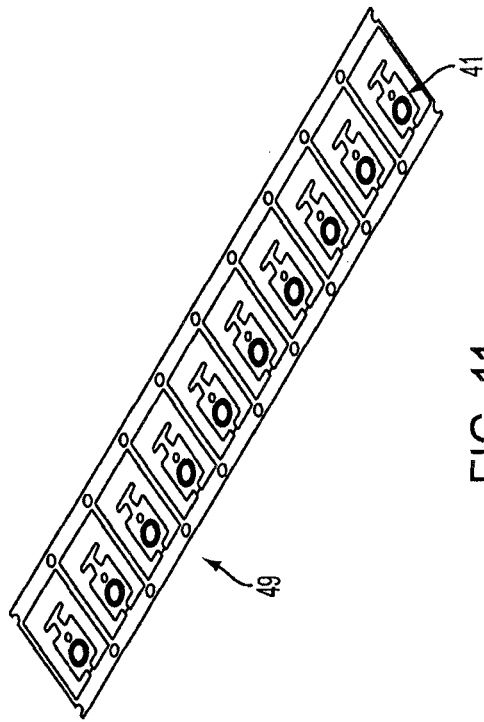
FIG. 11 is a perspective illustration of swage mounts manufactured on a fret.

The swage mounts 41 can be manufactured on a fret 50, as shown in FIGS. 10-12. Manufacturing and handling on a fret 50 can reduce manufacturing costs in certain applications. The swage mount 41 is removed from the strip along the trim line 51 before assembly.

Alternatively, the swage mounts 41 can be individually manufactured and processed without frets. Individual processing reduces cost of delivery associated with the packaging and material required to deliver a fret. Individual processing improves drive reliability because it prevents problems associated with cutting burrs and particles resulting from removing parts from a fret frame during processing.

Figure 13:
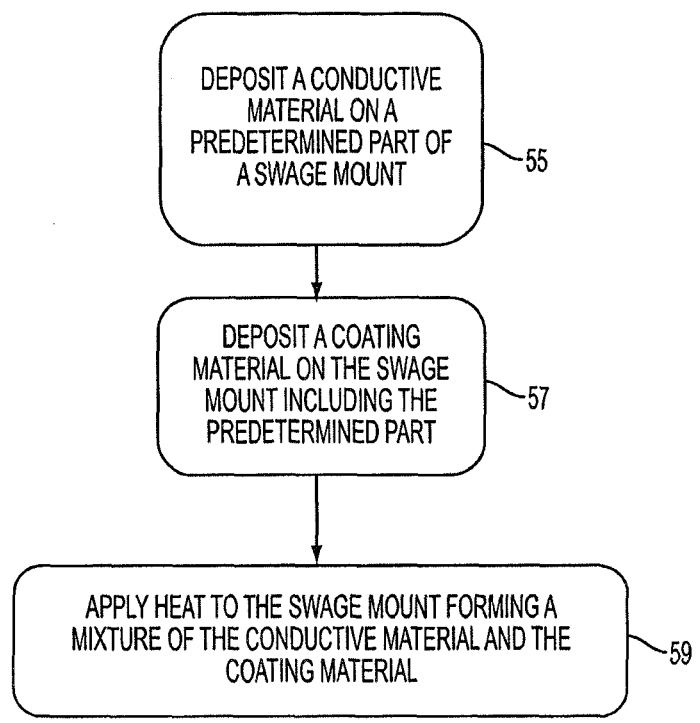
FIG. 13 is a flowchart diagram illustrating the steps of a method of manufacturing the swage mount.

FIG. 13 is a flowchart diagram of a method of manufacturing the swage mount 41. In step 55, the conductive material is deposited on the predetermined part 44 of the swage mount 41. "Depositing" as used herein refers to plating, coating, physical vapor or chemical vapor depositing, sputtering, or affixing a material on a surface of another material.

In a preferred embodiment, the swage mount 41 is plated with a continuous strip of gold having a thickness of 250 nanometers on the predetermined part 44. In other embodiments, other conductive materials with different thicknesses can be deposited based on design concerns. The predetermined part 44 includes the electrical connection parts of the swage mount 41.

In step 57, a coating material is deposited on the swage mount 41 including the predetermined part 44. For example, the coating material is nickel, which is plated on the swage mount 41 including the predetermined part 44 covered with gold. Nickel plating can be performed on an individually manufactured and processed swage mount 41. Alternatively, nickel plating can be performed on swage mounts 41 on the fret 50, or on swage mounts 41 that are stamped and removed from the fret 50.

Nickel can be plated such that it covers all edges of the swage mount 41 for enhancing cleanliness. In other embodiments, the plated nickel covers the predetermined part 44, but does not cover all surface areas of the swage mount 41.

In a preferred embodiment, the swage mount 41 is electroplated with 700 nanometers of Watts sulfamate nickel using periodic current reversal. Test results showed that after heat-treatment as discussed below in step 59, the swage mounts 41 of the preferred embodiment showed superior ductility during the swaging process, as compared with swage mounts that were plated using other processes such as electroless nickel plating. The preferred embodiment did not crack during the swaging process as shown by SEM examination of the hub 45, whereas electroless nickel plated swage mounts cracked under applied swaging force and torque.

In step 59, heat is applied to the swage mount 41, forming a mixture of the conductive material and the coating material on the predetermined part 44. For example, the swage mount is heat treated or annealed in a furnace. In a preferred embodiment, the conductive material is gold, which diffuses through the nickel plated layer. The resulting mixture has a color similar to silver. Nickel remains in other parts of the swage mount 41 where gold was not previously plated.

Figure 14:
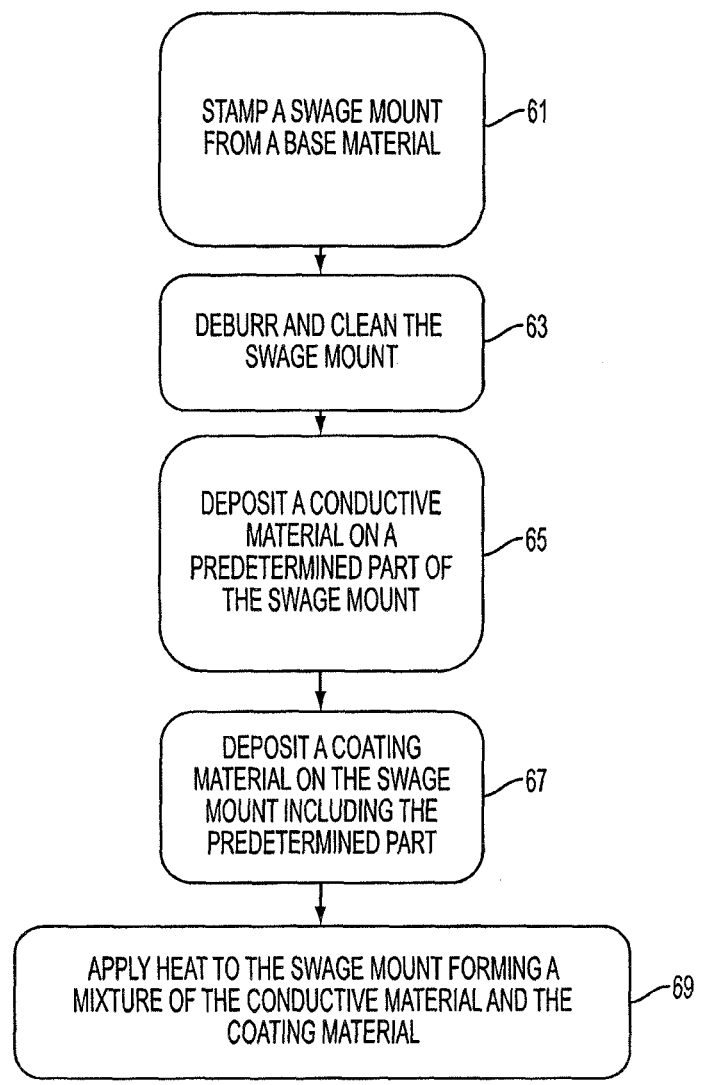
FIG. 14 is a flowchart diagram illustrating the steps of a method of manufacturing the swage mount.

FIG. 14 is a flowchart diagram of a method of manufacturing the swage mount 41. In step 61, a swage mount 41 is stamped from a base material. The base material can be raw material made of stainless steel (for example, austenitic stainless steel), and is not yet shaped and formed as a swage mount. Alternatively, the base material can be an alloy of stainless steel or another material with similar characteristics. "Stamping" as used herein refers to any process of forming a swage mount from base material that is not yet cut and formed in the shape of a swage mount. For example, stamping can refer to cutting or forming a swage mount out of an unformed flat piece of metal using a die.

In step 63, the stamped swage mount 41 is deburred and cleaned. Swage mounts 41 after stamping can have burrs and rough edges that can flake off and contaminate the drive mechanism. "Deburring" as used herein refers to any method of smoothing or polishing rough surfaces or edges of the swage mount, for example, by chemical deburring or mechanical tumbling using polishing or deburring media. The swage mount 41 can be further cleaned after deburring. Although the deburring step is discussed herein with respect to FIGS. 13-17, deburring is an optional step. For example, when the swage mount 41 and/or base material is nickel plated, polishing/deburring may not be required.

In step 65, the conductive material is deposited on the predetermined part of the swage mount 41 similarly to step 55 of FIG. 13. In step 67, a coating material is deposited on the swage mount including the predetermined part 44 similarly to step 57 of FIG. 13. In step 69, heat is applied to the swage mount similarly to step 59, forming a mixture of the conductive material and the coating material.

Figure 15:
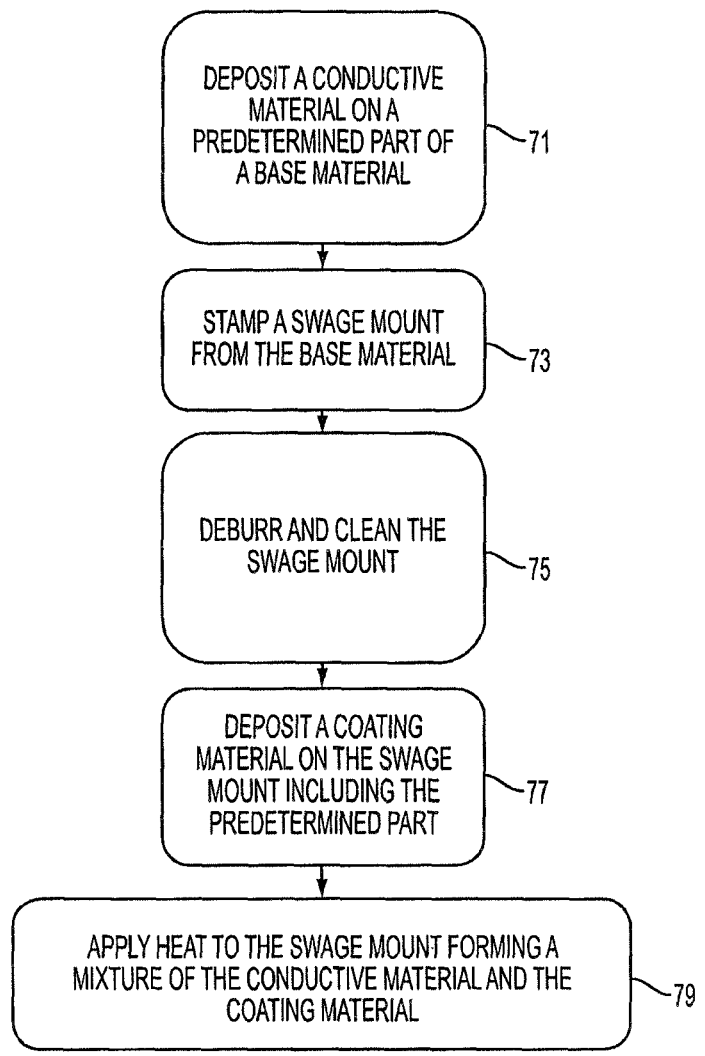
FIG. 15 is a flowchart diagram illustrating the steps of a method of manufacturing the swage mount.

FIG. 15 shows an alternative method of manufacturing the swage mount 41. In step 71, a conductive material is deposited on a predetermined part 44 of the base material. In step 73, the swage mount 41 is stamped from the base material. In step 75, the swage mount 41 is deburred and cleaned. In step 77, a coating material is deposited on the swage mount 41 including the predetermined part 44. In step 79, heat is applied to the swage mount 41, forming the mixture of the conductive material and the coating material. For certain cost-sensitive applications, this method is preferred because plating a continuous strip of conductive material on the base material can be more cost-effective than selectively plating conductive materials on swage mounts 41 due to handling, fixturing and non-continuous plating challenges.

Figure 16:
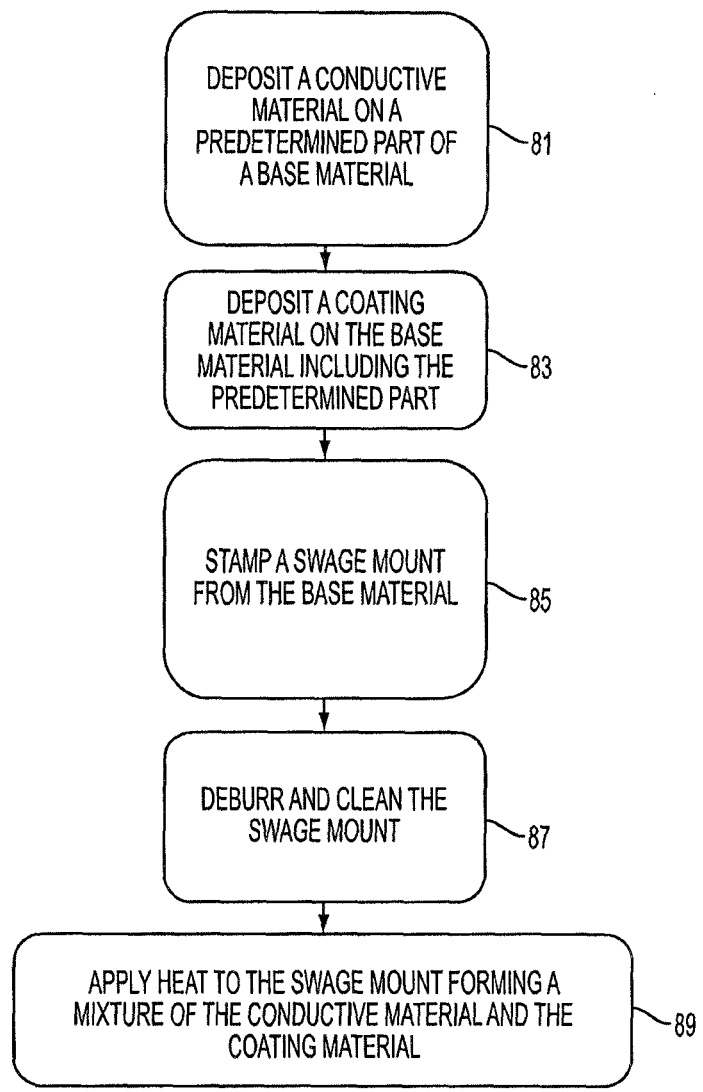
FIG. 16 is a flowchart diagram illustrating the steps of a method of manufacturing the swage mount.

Alternatively, the conductive material and the coating material can be deposited before stamping the swage mount, as shown in FIG. 16. In step 81, a conductive material is deposited on the base material. In step 83, a coating material is deposited on the base material including the predetermined part 44. In step 85, the swage mount 41 is stamped from the base material. In step 87, the swage mount 41 is deburred and cleaned. In step 89, heat is applied to the swage mount 41, forming the mixture of the conductive material and the coating material.

Figure 17:
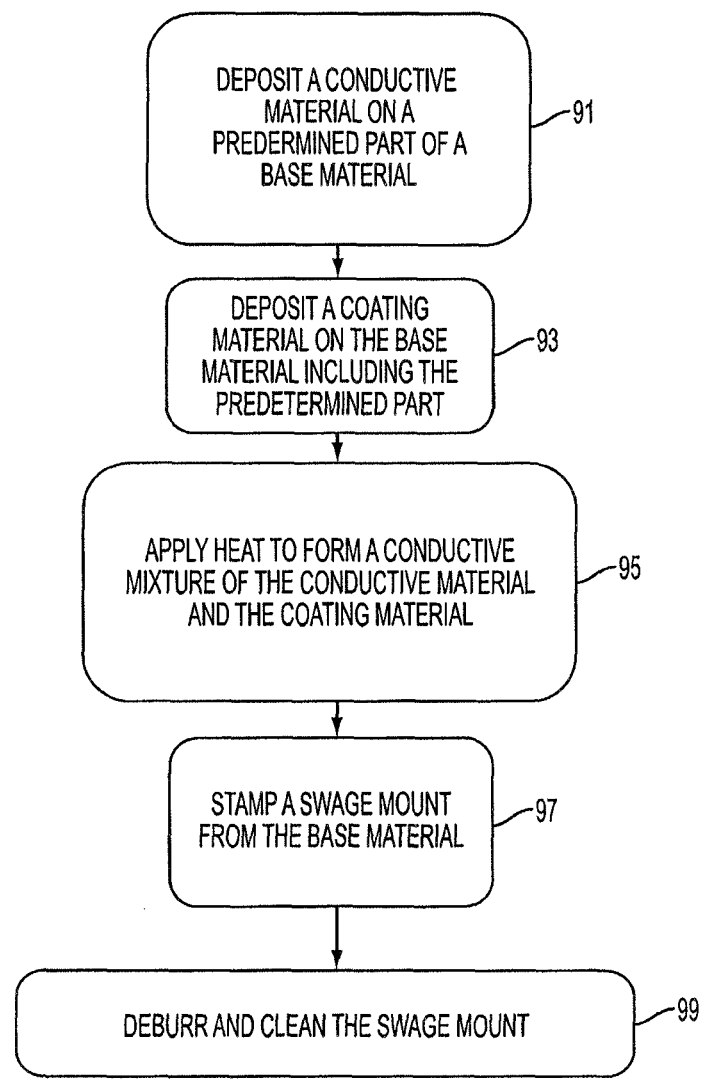
FIG. 17 is a flowchart diagram illustrating the steps of a method of manufacturing the swage mount.

Alternatively, the conductive material and the coating material can be deposited on the base material and heat treated before stamping, as shown in FIG. 17. In step 91, a conductive material is deposited on the base material. In step 93, a coating material is deposited on the base material including the predetermined part 44. In step 95, heat is applied to the base material, forming the mixture of the conductive material and the coating material. In step 97, the swage mount 41 is stamped from the base material. In step 99, the swage mount 41 is deburred and cleaned.

A unique advantage of the present invention is that the mixture on the predetermined part significantly enhances cleanliness, yet supports a reliable electrical connection. More particularly, the impedance of the mixture is low even after environmental exposure. Furthermore, the coating material in other parts reduces or eliminates shed particles that would otherwise negatively impact disk drive performance. Another advantage of the present invention is that the method is cost-effective because the conductive material does not need to be selectively plated on stamped swage mounts. Plating substantially the entire swage mount with the coating material and heat treatment significantly reduce the overall manufacturing cost.

What is claimed is:

1. A method of manufacturing a swage mount for hard disk drives, the method comprising:
   depositing a conductive material on a predetermined part of the swage mount;
   depositing a coating material on the swage mount including the predetermined part; and
   applying heat to the swage mount, forming a mixture of the conductive material and the coating material.

2. The method of claim 1, further comprising:
   stamping a swage mount from a base material, wherein the depositing the coating material is performed on the stamped swage mount.

3. The method of claim 1, wherein the coating material is selected from the group consisting of: nickel, sulfamate nickel, and palladium, or an alloy of one of the group.

4. The method of claim 1, wherein the coating material is nickel, and the depositing the coating material includes plating the predetermined part and other parts of the swage mount with nickel.

5. The method of claim 1, wherein the conductive material is one of the group consisting of gold, platinum, rhodium, tin, and silver, or an alloy of one of the group.

6. The method of claim 2, wherein the base material is made of stainless steel.

7. A method of manufacturing a swage mount for hard disk drives out of a base material, the method comprising:
   depositing a conductive material on a predetermined part of the base material;
   stamping a swage mount from the deposited base material;

depositing a coating material on the swage mount including the predetermined part; and applying heat to the swage mount, forming a mixture of the conductive material and the coating material.

8. The method of claim 7, further comprising:

deburring the stamped swage mount, wherein the depositing the coating material is performed on the deburred swage mount.

9. The method of claim 7, wherein the coating material is selected from the group consisting of: nickel, sulfamate nickel, and palladium, or an alloy of one of the group.

10. The method of claim 7, wherein the coating material is nickel, and the depositing the coating material includes plating the predetermined part and other parts of the swage mount with nickel.

11. The method of claim 7, wherein the conductive material is one of the group consisting of gold, platinum, rhodium, tin, and silver, or an alloy of one of the group.

12. The method of claim 7, wherein the base material is made of stainless steel.

13. A method of manufacturing a swage mount for hard disk drives out of a base material, the method comprising:

depositing a conductive material on a predetermined part of the base material;

depositing a coating material on the base material including the predetermined part;

stamping a swage mount from the deposited base; and applying heat to the swage mount, forming a mixture of the conductive material and the coating material.

14. The method of claim 13, wherein the coating material is selected from the group consisting of nickel, sulfamate nickel, and palladium, or an alloy of one of the group.

15. The method of claim 13, wherein the coating material is nickel, and the depositing the coating material includes plating the predetermined part and other parts of the swage mount with nickel.

16. The method of claim 13, wherein the conductive material is one of the group consisting of gold, platinum, rhodium, tin, and silver, or an alloy of one of the group.

17. The method of claim 13, wherein the base material is made of stainless steel.

18. A method of manufacturing a swage mount for hard disk drives out of a base material, the method comprising:

depositing a conductive material on a predetermined part of the base material;

depositing a coating material on the base material including the predetermined part;

applying heat to the base material, forming a mixture of the conductive material and the coating material; and stamping a swage mount from the deposited and heat applied base material.

19. The method of claim 18, wherein the coating material is selected from the group consisting of nickel, sulfamate nickel, and palladium, or an alloy of one of the group.

20. The method of claim 18, wherein the coating material is nickel, and the depositing the coating material includes plating the predetermined part and other parts of the swage mount with nickel.

21. The method of claim 18, wherein the conductive material is one of the group consisting of gold, platinum, rhodium, tin, and silver, or an alloy of one of the group.

22. The method of claim 18, wherein the base material is made of stainless steel.

* * * * *